(12) United States Patent
Cheng

(10) Patent No.: US 6,171,976 B1
(45) Date of Patent: Jan. 9, 2001

(54) METHOD OF CHEMICAL-MECHANICAL POLISHING

(75) Inventor: Chih-Hung Cheng, Hsinchu (TW)

(73) Assignee: United Semiconductor Corp., Hsinchu (TW)

(*) Notice: Under 35 U.S.C. 154(b), the term of this patent shall be extended for 0 days.

(21) Appl. No.: 09/261,098

(22) Filed: Mar. 2, 1999

(30) Foreign Application Priority Data

Jan. 22, 1999 (TW) .................................. 88100969

(51) Int. Cl.⁷ ........................ H01L 21/302; H01L 21/461
(52) U.S. Cl. ........................ 438/760; 438/692; 438/691
(58) Field of Search .................................. 438/114, 462, 438/690–692, 759

(56) References Cited

U.S. PATENT DOCUMENTS

| 4,487,635 | * | 12/1984 | Kugimiya et al. | 148/1.5 |
|---|---|---|---|---|
| 5,292,689 | * | 3/1994 | Cronin et al. | 437/228 |
| 5,362,669 | * | 11/1994 | Boyd et al. | 437/67 |
| 5,602,423 | * | 2/1997 | Jain | 257/52 |
| 5,670,410 | * | 9/1997 | Pan | 437/60 |
| 5,698,892 | * | 12/1997 | Koizumi et al. | 257/620 |
| 5,760,484 | * | 6/1998 | Lee et al. | 257/797 |
| 5,930,646 | * | 7/1999 | Gerung et al. | 438/431 |

FOREIGN PATENT DOCUMENTS 9-8039 * 1/1997 (JP) .......................... H01L 21/304

* cited by examiner

Primary Examiner—Charles Bowers
Assistant Examiner—Erik Kielin
(74) Attorney, Agent, or Firm—J. C. Patents; Jiawei Huang

(57) ABSTRACT

A method of chemical-mechanical polishing. A die region and a scribe line region are defined on a wafer. A dummy pattern is formed in the scribe line region. A dielectric layer is formed to cover the dummy pattern and the wafer. The dielectric layer is planarized by chemical-mechanical polishing.

11 Claims, 6 Drawing Sheets

METHOD OF CHEMICAL-MECHANICAL POLISHING

CROSS-REFERENCE TO RELATED APPLICATION

This application claims the priority benefit of Taiwan application serial no. 88100969, filed Jan. 22, 1999, the full disclosure of which is incorporated herein by reference.

BACKGROUND OF THE INVENTION

1. Field of the Invention

The present invention relates to a planarizing process. More particularly, the present invention relates to a method of chemical-mechanical polishing in which a dummy pattern is used.

2. Description of the Related Art

Chemical-mechanical polishing is currently the only technique capable of providing global planarization in VLSI process, and even in ULSI process.

FIG. 1 is a schematic, top view diagram of a conventional wafer. FIGS. 2A and 2B are schematic, cross-sectional diagrams of FIG. 1 along a line II—II, which are used to depict steps in a chemical-mechanical polishing process.

Referring to FIGS. 1 and 2A, a die region 102 and a scribe line region 104 are defined on a wafer 100. A width of the scribe line is 110 μm. A metal layer 106 is formed on the die region 102. A silicon dioxide layer 108 is formed to cover the wafer 100 and the metal layer 106 by chemical vapor deposition.

Referring to FIG. 2B, the silicon dioxide layer 108 is planarized by chemical-mechanical polishing.

As shown in FIGS. 2A and 2B, the height difference between the scribe line region 104 and the die region 102 is large because the metal layer 106 is formed on the die region 102 and nothing besides test keys is formed in the scribe line region 104, thus the surface of the silicon dioxide layer 108 is not formed flat. As a result, a part of the silicon dioxide layer 108 formed on the scribe line region 104 is easily polished in the chemical-mechanical polishing process, especially at an intersection between scribe lines. Therefore the uniformity of the silicon dioxide layer 108 is poor and a dishing effect occurs. Devices at a corner of the die region 102 are easily abraded.

FIGS. 3A and 3B are schematic, cross-sectional diagrams of FIG. 1 along a line II—II, which are used to depict steps in another chemical-mechanical polishing process.

Referring to FIG. 3A, a borophosphosilicate glass layer 110 is formed to cover the metal layer 106 and the wafer 100. A silicon dioxide layer 108 is formed on the borophosphosilicate glass layer 110.

Referring to FIG. 3B, the silicon dioxide layer 108 is planarized by chemical-mechanical polishing.

Although the borophosphosilicate glass layer 110 is formed to reduce the height difference between the die region 102 and the scribe line region 104, it has little effect. The dishing effect also occurs.

SUMMARY OF THE INVENTION

Accordingly, the present invention provides a method of chemical-mechanical polishing in which a dummy pattern that avoids a dishing effect is used.

To achieve these and other advantages and in accordance with the purpose of the invention, as embodied and broadly described herein, the invention provides a method of chemical-mechanical polishing in which a dummy pattern is used. A die region and a scribe line region are defined on a wafer. A dummy pattern is formed in the scribe line region. A dielectric layer is formed to cover the dummy pattern and the wafer. The dielectric layer is planarized by chemical-mechanical polishing.

By using the dummy pattern, the surface of the dielectric layer is flat when formed. As a result, the uniformity of the chemical-mechanical polishing process is improved and the dishing effect is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
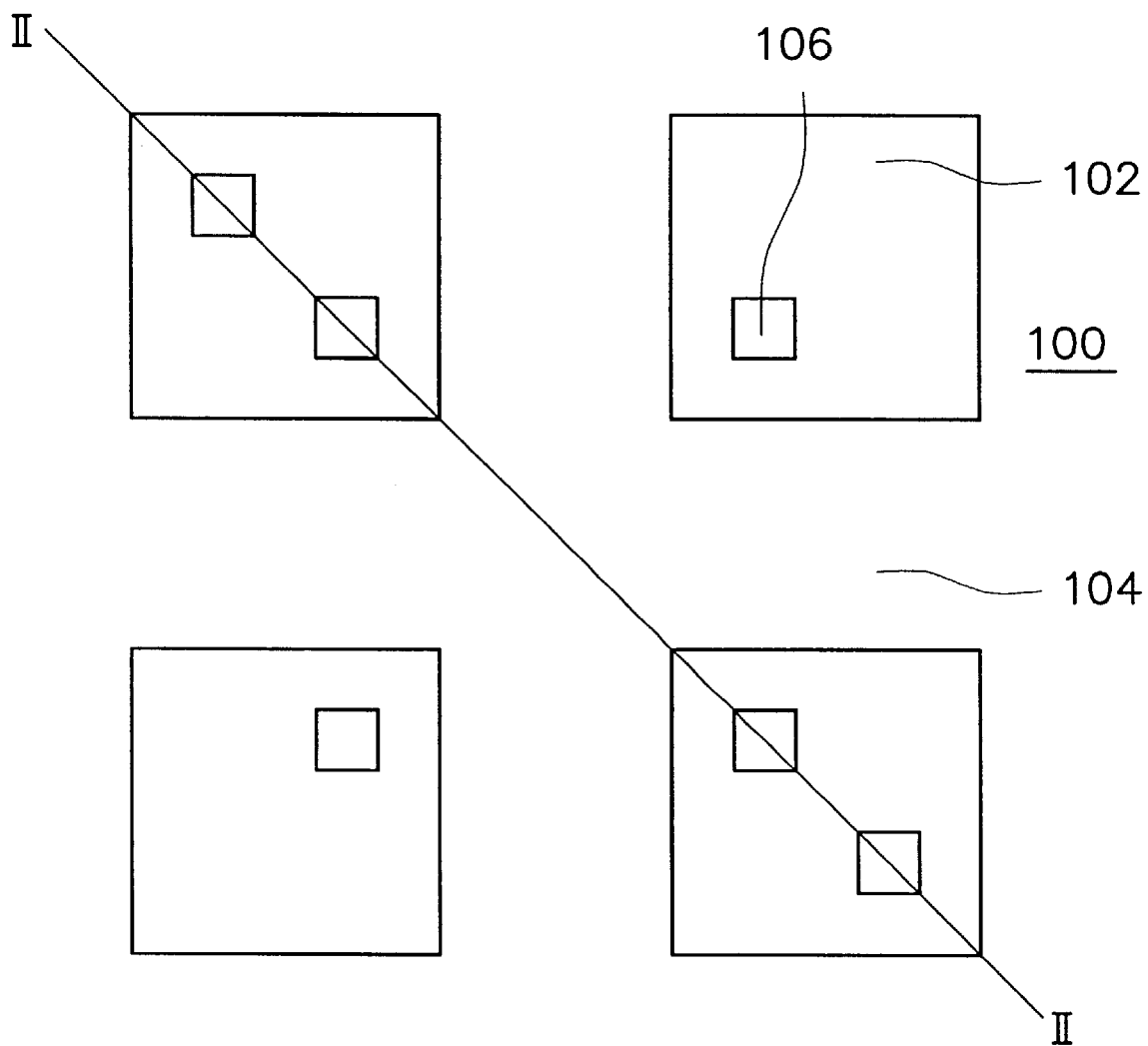
FIG. 1 is a schematic, top view diagram of a conventional wafer.
Figure 2A:
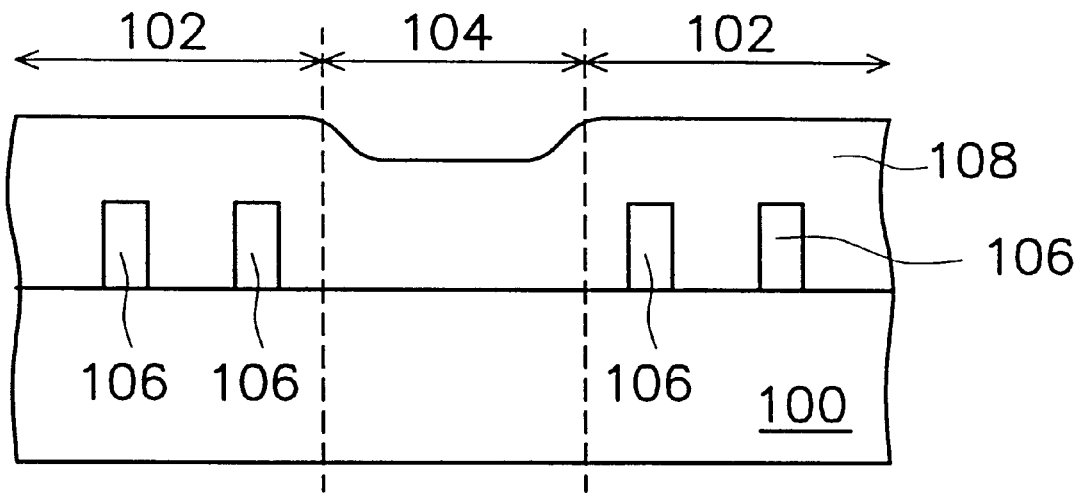
FIGS. 2A and 2B are schematic, cross-sectional diagrams of FIG. 1 along a line II—II, which are used to depict steps in a chemical-mechanical polishing process.
Figure 2B:
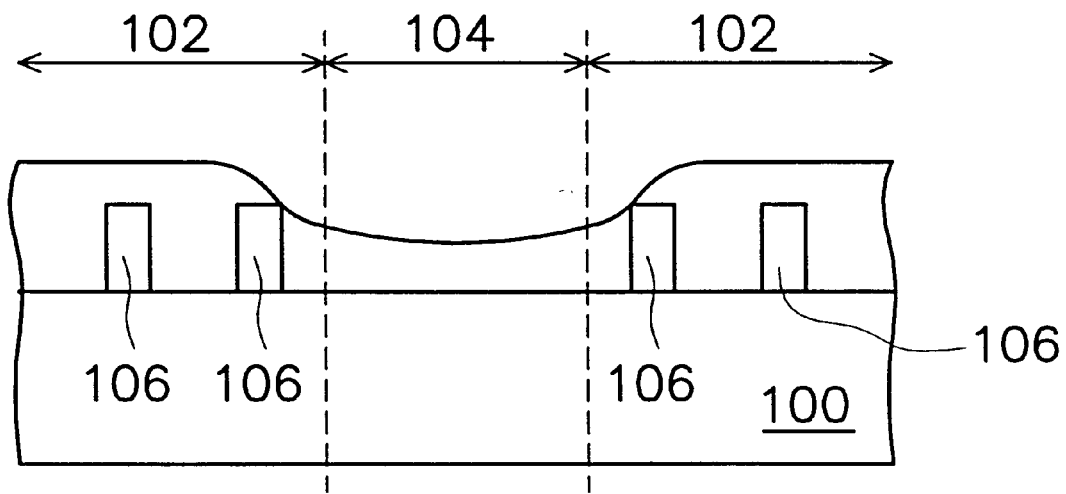
Figure 3A:
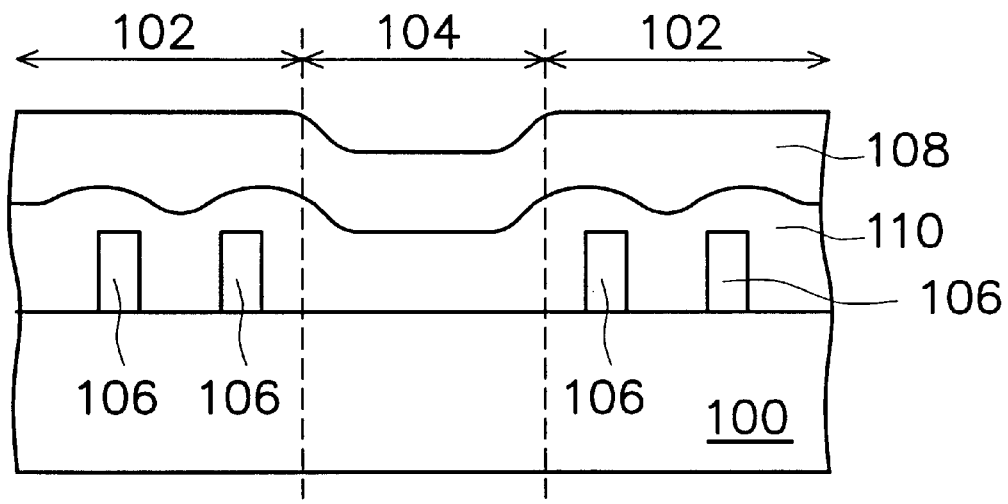
FIGS. 3A and 3B are schematic, cross-sectional diagrams of FIG. 1 along a line II—II, which are used to depict steps in another chemical-mechanical polishing process.
Figure 3B:
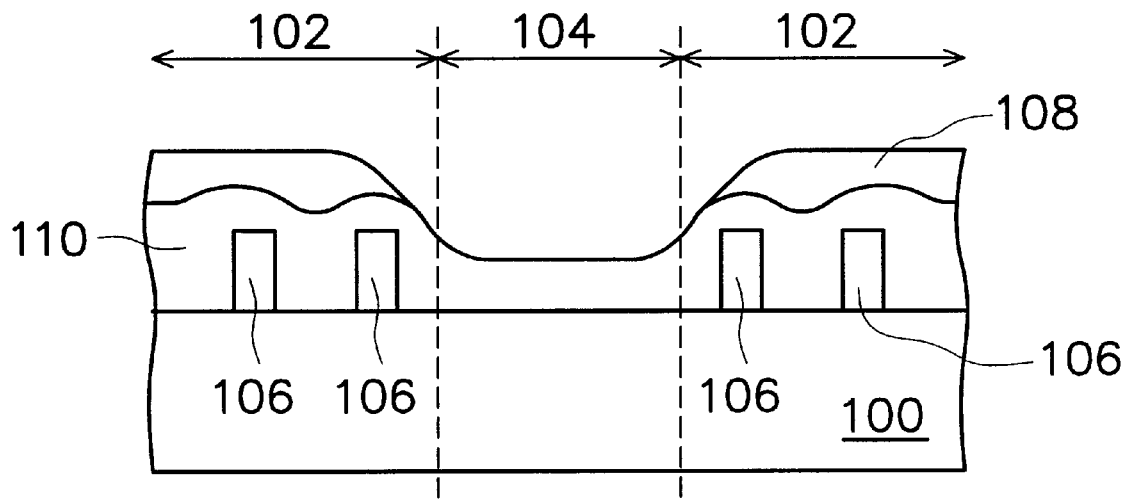

Reference will now be made in detail to the present preferred embodiments of the invention, examples of which are illustrated in the accompanying drawings. Wherever possible, the same reference numbers are used in the drawings and the description to refer to the same or like parts.

Figure 4:
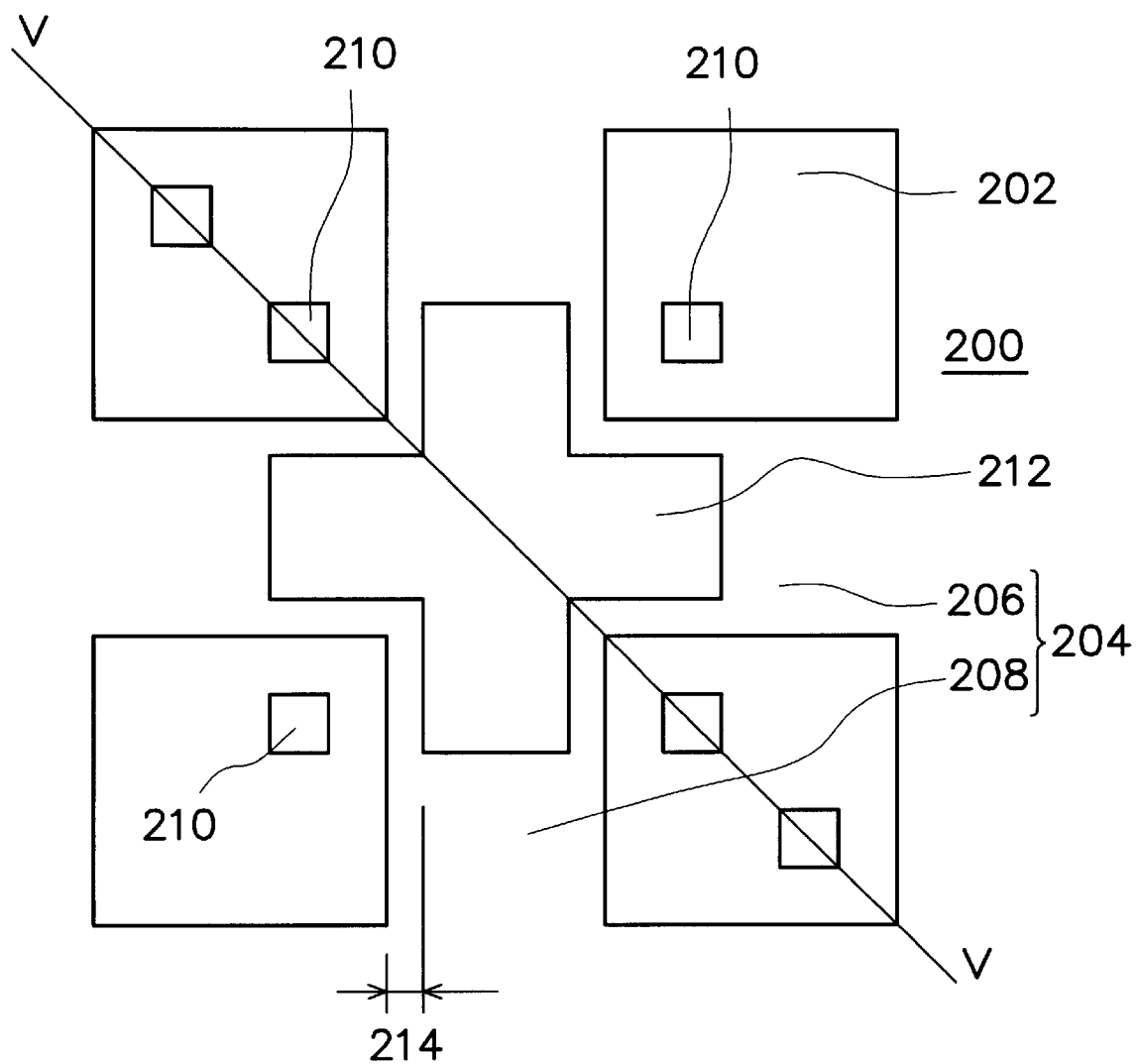
FIG. 4 is a schematic, top view diagram of a wafer having a dummy pattern according to the invention.

FIG. 4 is a schematic, top view diagram of a wafer having a dummy pattern according to the invention Referring to FIG. 4, a die region 202 and a scribe line region 204 are defined on a wafer 200. Devices 210 such as metal layers or polysilicon layers are formed on the die region 202. The scribe line region 204 includes a vertical scribe line 208 and a horizontal scribe line 206. A width of the vertical scribe line 208 and a width of the horizontal scribe line 206 are both about 100 to 120 μm. Additionally, the vertical scribe line 208 crosses the horizontal scribe line 206.

A dummy pattern 212, which is cross in shape, is formed at an intersection between the vertical scribe line 208 and the horizontal scribe line 206. The dummy pattern 212 and the devices 210 are formed in the same process; thus the material of the dummy pattern 212 and the devices 210 is the same. A distance 214 between the dummy pattern 212 and the die region 214 is about 10 to 20 μm. A size of the dummy pattern 212 depends on the requirements of the process. In this embodiment, the dummy pattern 212 is formed at an intersection between the vertical scribe line 208 and the horizontal scribe line 206 but is not limited to this position. The dummy pattern 212 can be formed at any position to meet the requirements of the process.

Figure 5A:
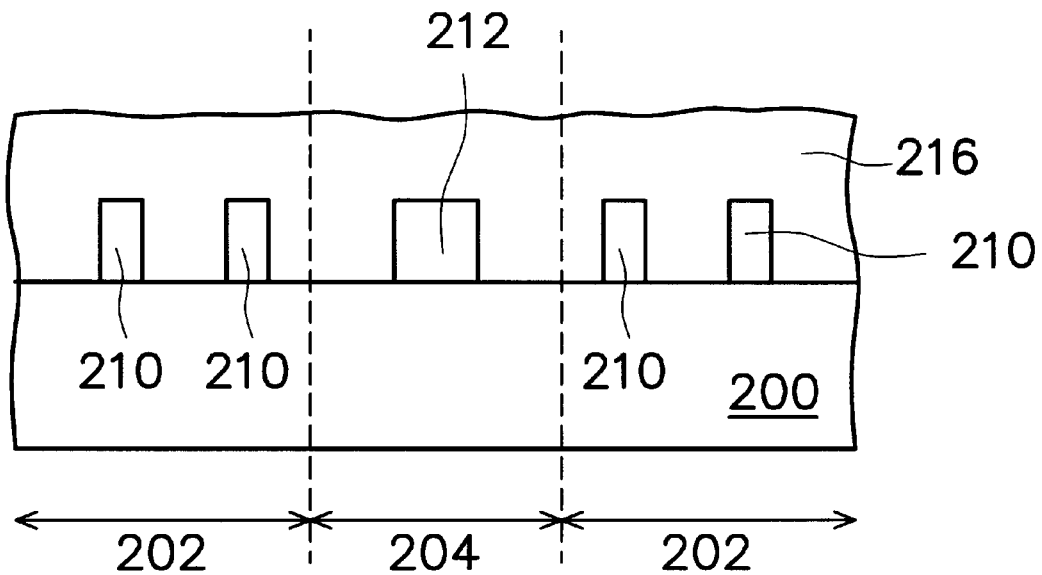
FIGS. 5A and 5B are schematic, cross-sectional diagrams of FIG. 4 along a line V—V, which are used to depict steps in a chemical-mechanical polishing process.

Referring to FIG. 5A, a dielectric layer 216 is formed to cover the wafer 200, the devices 210 and the dummy pattern 212 by, for example, chemical vapor deposition with tetra-ethyl-ortho-silicate as a gas resource. The dielectric layer 216 is preferably silicon dioxide.

Figure 5B:
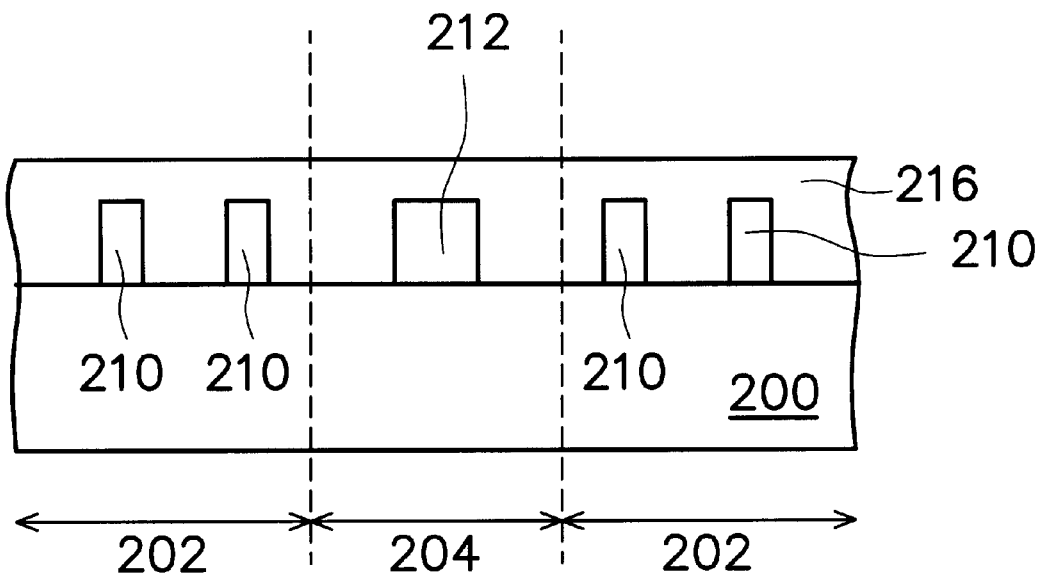

Referring to FIG. 5B, the dielectric layer 216 is planarized by, for example, chemical-mechanical polishing.

Since the dummy pattern 212 is formed in the scribe line region 204, the surface of the dielectric layer 216 is flatter than a similar layer produced by conventional technology. The uniformity of the chemical-mechanical polishing process is improved and the dishing effect is avoided.

The method mentioned above is also suitable for another chemical-mechanical polishing process.

Figure 6:
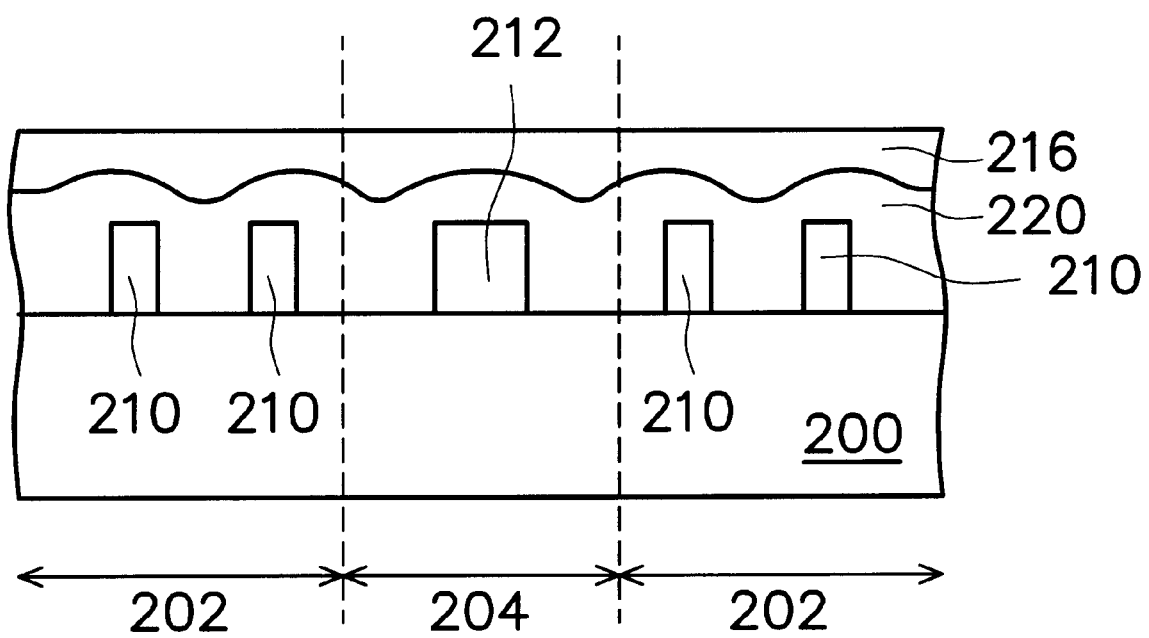
FIG. 6 is a schematic, cross-sectional diagrams of FIG. 4 along a line V—V after performing a chemical-mechanical polishing process.

Referring to FIG. 6, a fluid material layer 220 is formed to cover the wafer 200, the devices 210 and the dummy pattern 212 before forming the dielectric layer 216. The material used to form the fluid material layer 220 is selected from a group consisting of borophosphosilicate glass (BPSG), phosphosilicate glass (PSG), or spin on glass (SOG). Because of the dummy pattern 212, the surface of the fluid material layer 220 and the surface of the dielectric layer 216 are formed flat. The uniformity of the chemical-mechanical polishing process is improved and the dishing effect is avoided.

According to the foregoing, the advantages of the invention include the following:

1. The uniformity of the chemical-mechanical polishing process is improved by forming a dummy pattern in the scribe line. Additionally, the dishing effect is avoided.

2. Because the dummy pattern and the devices are formed in the same process, the invention is compatible with the conventional process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a dummy patter for a chemical-mechanical polishing process, comprising the steps of:

providing a wafer;

defining a die region and a scribe line region on the wafer;

forming the dummy pattern in the scribe line region;

forming a dielectric layer to cover the wafer and the dummy pattern; and planarizing the dielectric layer by chemical-mechanical polishing.

2. The method of claim 1, wherein the scribe line region includes a vertical scribe line and a horizontal scribe line.

3. The method of claim 2, wherein widths of the vertical scribe line and the horizontal scribe line are both about 100 to 120 μm.

4. The method of claim 2, wherein the dummy pattern is formed at an intersection between the vertical scribe line and the horizontal scribe line.

5. The method of claim 4, wherein the shape of the dummy pattern is cross.

6. The method of claim 1, wherein a distance between the die region and the dummy pattern is about 10 to 20 μm.

7. The method of claim 1, further comprising the step of forming a fluid material layer before forming the dielectric layer.

8. The method of claim 6, wherein the material used to form the fluid material layer is selected from a group consisting of borophosphosilicate glass, phosphosilicate glass, and spin on glass.

9. The method of claim 1, wherein the dummy pattern includes polysilicon.

10. The method of claim 1, wherein the dummy pattern includes metal.

11. The method of claim 1, a plurality of devices are formed in the die region while forming the dummy pattern.

* * * * *